United States Patent
Ikeda et al.

(10) Patent No.: US 10,319,567 B2
(45) Date of Patent: Jun. 11, 2019

(54) MICROWAVE PLASMA SOURCE AND PLASMA PROCESSING APPARATUS

(71) Applicant: TOKYO ELECTRON LIMITED, Tokyo (JP)

(72) Inventors: Taro Ikeda, Nirasaki (JP); Akira Tanihara, Nirasaki (JP); Shigeru Kasai, Nirasaki (JP); Nobuhiko Yamamoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 405 days.

(21) Appl. No.: 15/075,670

(22) Filed: Mar. 21, 2016

(65) Prior Publication Data

US 2016/0284516 A1 Sep. 29, 2016

(30) Foreign Application Priority Data

Mar. 24, 2015 (JP) ................. 2015-060867

(51) Int. Cl.
*C23C 16/00* (2006.01)
*C23F 1/00* (2006.01)
(Continued)

(52) U.S. Cl.
CPC .... *H01J 37/3222* (2013.01); *H01J 37/32192* (2013.01); *H01J 37/32211* (2013.01); *H01J 37/32238* (2013.01)

(58) Field of Classification Search
USPC ............... 118/723 MW; 156/345.41
See application file for complete search history.

(56) References Cited

U.S. PATENT DOCUMENTS

2004/0134613 A1* 7/2004 Ohmi ............... H01J 37/32192
156/345.41
2005/0160987 A1* 7/2005 Kasai .................. H05B 6/705
118/723 MW
(Continued)

FOREIGN PATENT DOCUMENTS

| JP | 2000-294550 A | 10/2000 |
| JP | 2012-216745 A | 11/2012 |
| WO | 2008/013112 A1 | 1/2008 |

*Primary Examiner* — Rakesh K Dhingra
(74) *Attorney, Agent, or Firm* — Nath, Goldberg & Meyer; Jerald L. Meyer

(57) ABSTRACT

A microwave plasma source for forming a surface wave plasma by radiating a microwave into a chamber of a plasma processing apparatus, which includes: a microwave output part for outputting the microwave; a microwave transmission part for transmitting the microwave; and a microwave radiation member for radiating the microwave into the chamber. The microwave transmission part includes a plurality of microwave introduction mechanisms circumferentially arranged in a peripheral portion of the microwave radiation member and configured to introduce the microwave into the microwave radiation member. The microwave radiation member includes a metal main body, a plurality of dielectric slow-wave members arranged in an overall annular shape in the vicinity of an arrangement surface of the main body, an annular dielectric microwave transmission member arranged in a microwave radiation surface of the main body, and a slot antenna part installed between the slow-wave members and the microwave transmission member.

12 Claims, 11 Drawing Sheets

(51) Int. Cl.
  *H01L 21/306* (2006.01)
  *H01J 37/32* (2006.01)

(56) References Cited

U.S. PATENT DOCUMENTS

| | | | |
|---|---|---|---|
| 2009/0045749 A1* | 2/2009 | Ganachev | H01J 37/32192 315/111.21 |
| 2011/0174778 A1* | 7/2011 | Sawada | H01J 37/32091 216/68 |
| 2012/0090782 A1* | 4/2012 | Ikeda | H01J 37/32293 156/345.28 |
| 2012/0247675 A1* | 10/2012 | Ikeda | C23C 16/45565 156/345.34 |

* cited by examiner

MICROWAVE PLASMA SOURCE AND PLASMA PROCESSING APPARATUS

CROSS-REFERENCE TO RELATED APPLICATION

This application claims the benefit of Japanese Patent Application No. 2015-060867, filed on Mar. 24, 2015, in the Japan Patent Office, the disclosure of which is incorporated herein in its entirety by reference.

TECHNICAL FIELD

The present disclosure relates to a microwave plasma source and a plasma processing apparatus including the same.

BACKGROUND

A plasma process is a technique essential for manufacture of semiconductor devices. With recent demands for high integration and high speed of LSI, a design rule of semiconductor devices has been finer and finer and the size of semiconductor wafers has been increased. Accordingly, there is a need for a plasma processing apparatus to cope with such fineness and increase in size.

However, parallel-plate type or inductively-coupled plasma processing apparatuses, which have been conventionally widely used, have a difficulty in processing large diameter semiconductor wafers with plasma with uniformity and at a high speed.

For the purpose of avoiding such a difficulty, attention has been paid to an RLSA® microwave plasma processing apparatus which is capable of uniformly forming a surface wave plasma with high density and at a low electron temperature.

In the RLSA® microwave plasma processing apparatus, as a microwave radiation antenna which radiates a microwave for generating the surface wave plasma, a radial line slot antenna used as a planar slot antenna having a plurality of slots formed therein in a predetermined pattern, is installed on an upper portion of a chamber. A microwave introduced from a microwave source is emitted through the antenna slots and is radiated into the chamber being in a vacuum state via a dielectric microwave transmission plate installed below the antenna slots. The surface wave plasma is generated inside the chamber by an electric field of the microwave so that a workpiece such as a semiconductor wafer or the like is processed.

In such an RLSA® microwave plasma processing apparatus, when plasma distribution is to be adjusted, there is a need to prepare a plurality of antennas having different slot shapes and patterns for any replacement, which is troublesome work.

For the purpose of avoiding this problem, there has been proposed a plasma source in which a microwave is distributed, a plurality of microwave introduction mechanisms including respective tuners for impedance-matching with the above-mentioned planar antennas are installed, and microwaves radiated therefrom are guided into the chamber and spatially composed inside the chamber.

Such spatial composition of the microwaves using the plurality of microwave introduction mechanisms individually adjusts phase and intensity of the microwaves introduced from the microwave introduction mechanisms, thereby adjusting a plasma distribution with relative ease.

In addition, there has been proposed a technique in which a plurality of microwave introduction mechanisms is arranged to achieve a uniform plasma distribution.

Furthermore, in such conventional techniques, a dielectric microwave transmission window (microwave transmission member) for each microwave introduction mechanism is installed in a ceiling wall of the chamber, and a microwave is radiated into the chamber via the microwave transmission window. However, this fails to sufficiently spread plasma in a circumferential direction. In other words, the number of the microwave radiation mechanisms has to be increased in order to achieve uniform plasma distribution.

SUMMARY

Some embodiments of the present disclosure provide to a microwave plasma source which is capable of increasing uniformity of plasma in a circumferential direction for fewer microwave radiation members, and a plasma processing apparatus including the same.

According to one embodiment of the present disclosure, there is provided a microwave plasma source for forming a surface wave plasma by radiating a microwave into a chamber of a plasma processing apparatus, including: a microwave output part configured to generate and output the microwave; a microwave transmission part configured to transmit the microwave outputted from the microwave output part; and a microwave radiation member constituting a ceiling wall of the chamber and configured to radiate the microwave, which is supplied from the microwave transmission part, into the chamber, wherein the microwave transmission part includes a plurality of microwave introduction mechanisms which is circumferentially arranged in a peripheral portion of the microwave radiation member corresponding to an internal peripheral portion of the chamber and is configured to introduce the microwave into the microwave radiation member. The microwave radiation member includes: a metal main body; a plurality of dielectric slow-wave members which is arranged in an overall annular shape in the vicinity of an arrangement surface of the main body on which the microwave introduction mechanisms are arranged, along an annular microwave introduction mechanism arrangement region including a portion where the plurality of microwave introduction mechanisms is arranged; an annular dielectric microwave transmission member which is arranged in a microwave radiation surface of the main body along the microwave introduction mechanism arrangement region; and a slot antenna part installed between the slow-wave members and the microwave transmission member and has a plurality of microwave radiation slots formed in an overall circumferential shape along the microwave introduction mechanism arrangement region. The plurality of slow-wave members is arranged such that adjacent slow-wave members are separated from each other by a metal member, the plurality of slow-wave members being twice as many as the microwave introduction mechanisms and being arranged to extend to both sides of a position where each of the microwave introduction mechanisms is disposed.

According to another embodiment of the present disclosure, there is provided a plasma processing apparatus which includes a chamber configured to accommodate a target substrate, a gas supply mechanism configured to supply a gas into the chamber, and a microwave plasma source configured to form a surface wave plasma by radiating a microwave into the chamber, and performs a plasma process on the target substrate using the surface wave plasma. The microwave plasma source includes: a microwave output part configured to generate and output a microwave; a microwave transmission part configured to transmit the microwave outputted from the microwave output part; and a microwave radiation member constituting a ceiling wall of the chamber and configured to radiate the microwave, which is supplied from the microwave transmission part, into the chamber. The microwave transmission part includes a plurality of microwave introduction mechanisms which is circumferentially arranged in a peripheral portion of the microwave radiation member, which corresponds to an internal peripheral portion of the chamber, and is configured to introduce the microwave into the microwave radiation member. The microwave radiation member includes: a metal main body; a plurality of dielectric slow-wave members which is arranged in an overall annular shape in the vicinity of an arrangement surface of the main body on which the microwave introduction mechanisms are arranged, along an annular microwave introduction mechanism arrangement region including a portion where the plurality of microwave introduction mechanisms is arranged; an annular dielectric microwave transmission member which is arranged in a microwave radiation surface of the main body along the microwave introduction mechanism arrangement region; and a slot antenna part which is interposed between the slow-wave members and the microwave transmission member and has a plurality of microwave radiation slots formed in an overall circumferential shape along the microwave introduction mechanism arrangement region. The plurality of slow-wave members is arranged such that adjacent slow-wave members are separated from each other by a metal member, the plurality of slow-wave members being twice as many as the microwave introduction mechanisms and being arranged to extend to both sides of a position where each of the microwave introduction mechanisms is disposed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Configuration of Plasma Processing Apparatus>

Figure 1:
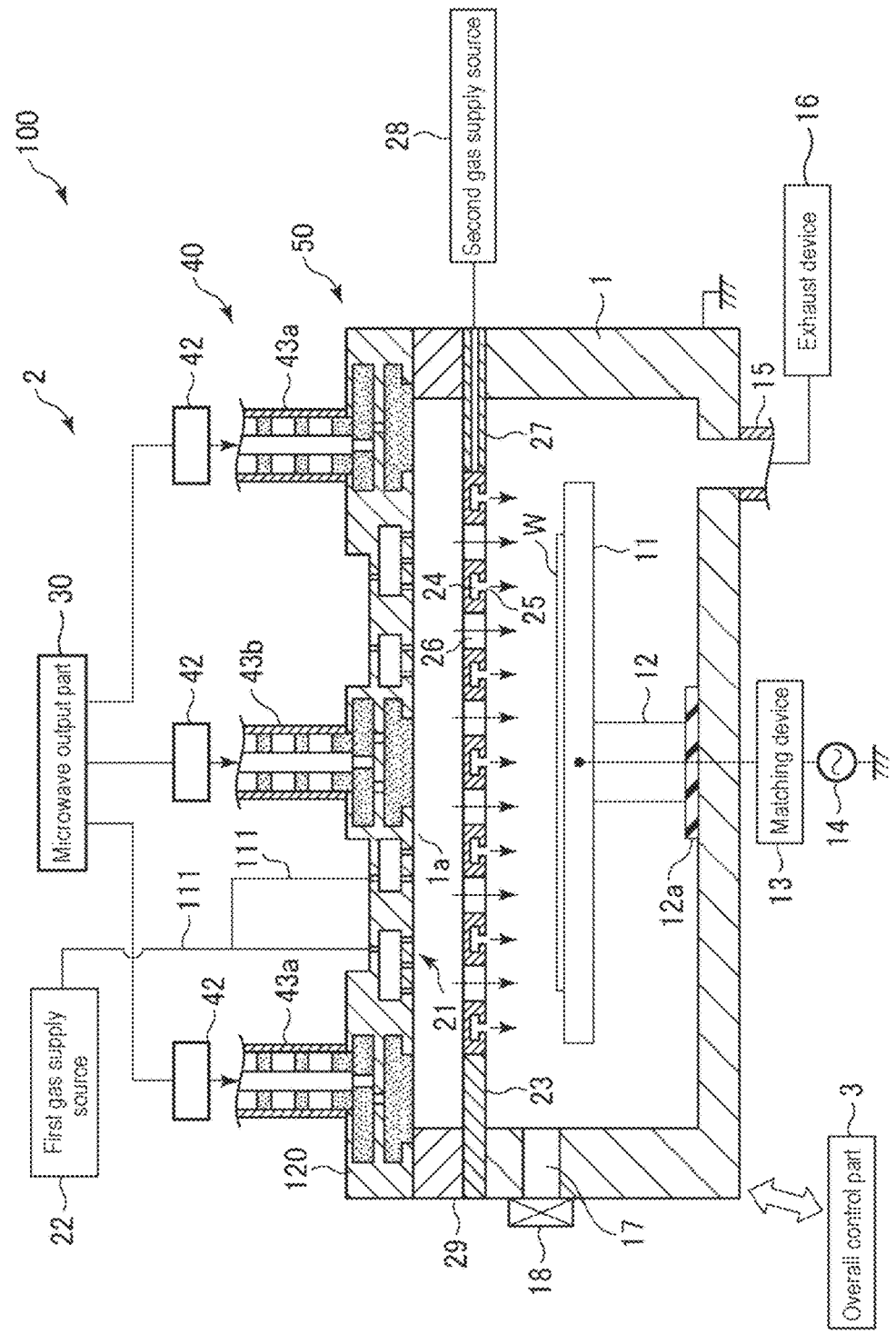
FIG. 1 is a sectional view illustrating a schematic configuration of a plasma processing apparatus according to one embodiment of the present disclosure.
Figure 2:
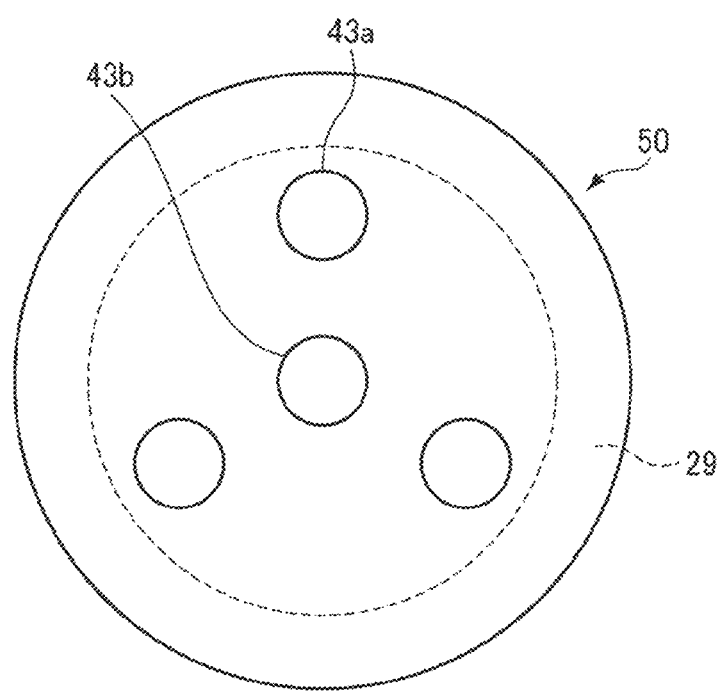
FIG. 2 is a plan view schematically illustrating microwave introduction mechanisms in a microwave plasma source used for the plasma processing apparatus of FIG. 1.
Figure 3:
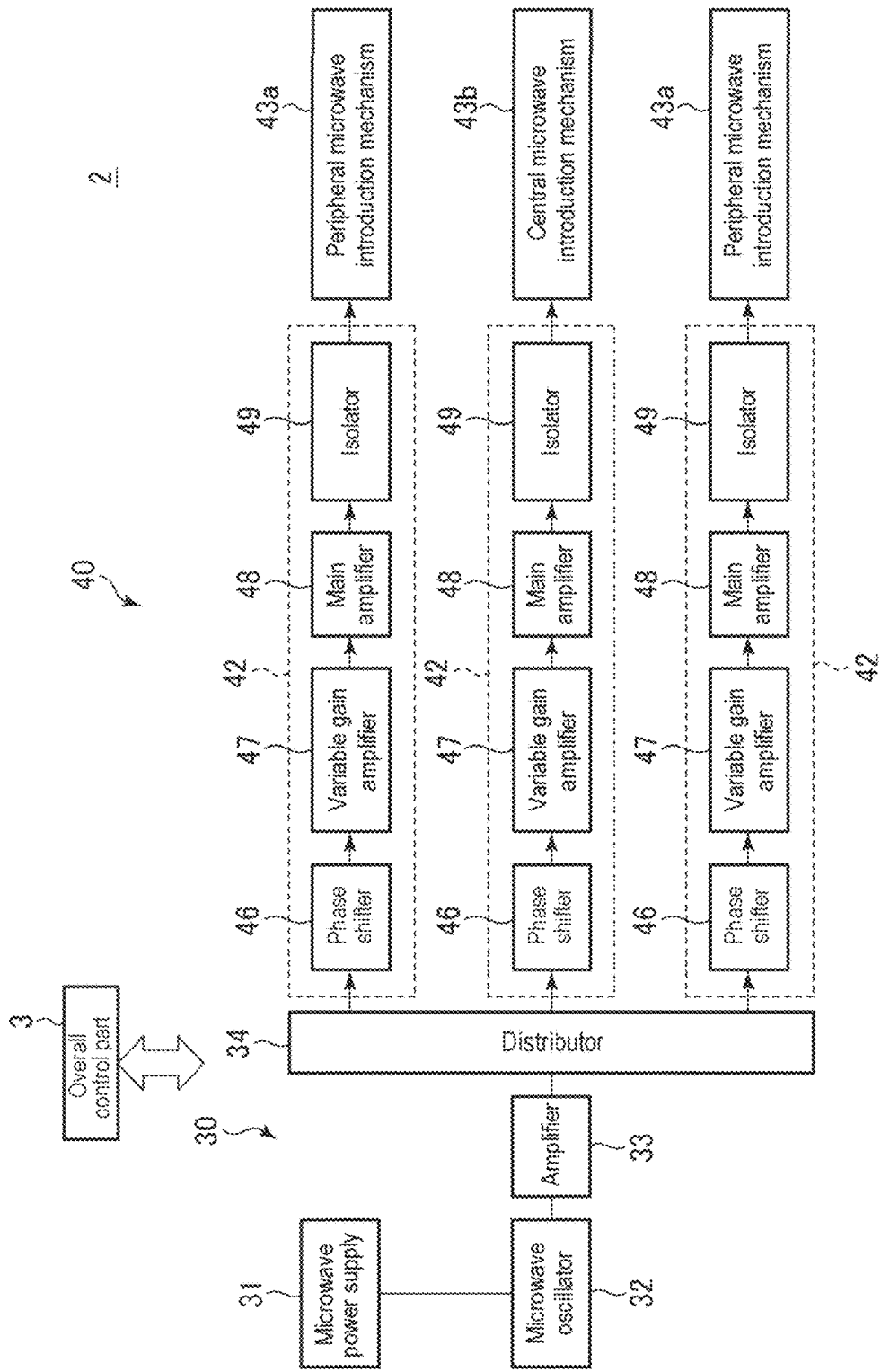
FIG. 3 is a block diagram illustrating a configuration of the microwave plasma source used for the plasma processing apparatus of FIG. 1.

FIG. 1 is a sectional view illustrating a schematic configuration of a plasma processing apparatus according to one embodiment of the present disclosure. FIG. 2 is a plan view schematically illustrating an arrangement of microwave introduction mechanisms in a microwave plasma source used for the plasma processing apparatus of FIG. 1. FIG. 3 is a block diagram illustrating a configuration of the microwave plasma source used for the plasma processing apparatus of FIG. 1.

A plasma processing apparatus 100 is provided to perform a predetermined plasma process with respect to wafers using a surface wave plasma generated by a microwave. An example of the plasma process may include a film forming process or an etching process.

The plasma processing apparatus 100 includes a grounded airtight cylindrical chamber 1 made of a metal material such as aluminum or stainless steel, and a microwave plasma source 2 configured to generate a surface wave plasma inside the chamber 1 by introducing a microwave into the chamber 1. An opening 1*a* is formed in an upper portion of the chamber 1. The microwave plasma source 2 is installed to face the interior of the chamber 1 through the opening 1*a*.

In addition, the plasma processing apparatus 100 includes an overall control part 3 equipped with a microprocessor. The overall control part 3 is configured to control respective components of the plasma processing apparatus 100. The overall control part 3 includes a storage part storing a process sequence of the plasma processing apparatus 100 and process recipes as control parameters, an input means, a display and so on, and can perform a predetermined control according to a selected process recipe.

A susceptor (mounting table) 11 configured to horizontally support a semiconductor wafer W (hereinafter simply referred to as a "wafer W") as a workpiece is installed inside the chamber 1. The susceptor 11 is supported by a cylindrical support member 12 installed upright on the center of the bottom of the chamber 1 via an insulating member 12a. The susceptor 11 and the support member 12 are made of, for example, metal such as aluminum whose surface is alumite-treated (anodized), an insulating material (e.g., ceramics) having a high frequency electrode formed therein, or the like.

In addition, although not shown, the susceptor 11 includes an electrostatic chuck for electrostatically adsorbing the wafer W, a temperature control mechanism, a gas passage through which a heat transfer gas is supplied onto a rear surface of the wafer W, lift pins configured to move up and down to transfer the wafer W, and so on. Further, the susceptor 11 is electrically coupled to an RF (Radio Frequency) bias power supply 14 via a matching device 13. When RF power is supplied from the RF bias power supply 14 to the susceptor 11, ions in plasma are retracted to the wafer W side. The RF bias power supply 14 may be omitted depending on characteristics of the plasma process. In this case, even when the susceptor 11 is formed of an insulating member made of ceramics such as AlN or the like, no electrode is required.

An exhaust pipe 15 is connected to the bottom of the chamber 1. The exhaust pipe 15 is connected to an exhaust device 16 including a vacuum pump. When the exhaust device 16 is actuated to exhaust the chamber 1 so that the interior of the chamber 1 can be depressurized up to a predetermined degree of vacuum. A loading/unloading port 17 through which the wafer W is loaded into and unloaded from the chamber 1, and a gate valve 18 for opening/closing the loading/unloading port 17, are installed in a side wall of the chamber 1.

The microwave plasma source 2 includes a microwave output part 30, a microwave transmission part 40 and a microwave radiation member 50. The microwave output part 30 distributes and outputs a microwave on a plurality of paths. The microwave transmission part 40 transmits the microwave outputted from the microwave output part 30. The microwave radiation member 50 of a circular plate shape is installed on the top of the chamber 1 while being air-tightly sealed via a support ring 29 installed on the top, and radiates the microwave transmitted from the microwave transmission part 40 into the chamber 1. The microwave radiation member 50 constitutes a ceiling wall of the chamber 1. A first gas introduction part 21 having a shower structure is installed in the microwave radiation member 50. A first gas such as a plasma generation gas (e.g., an Ar gas), a gas to be decomposed with high energy (e.g., an $O_2$ gas or a $N_2$ gas) or the like, is supplied from a first gas supply source 22 into the first gas introduction part 21. The structure of the microwave plasma source 2 including the microwave radiation member 50 will be described in more detail later.

A second gas introduction part 23 used as a shower plate is horizontally located between the susceptor 11 inside the chamber 1 and the microwave radiation member 50. The second gas introduction part 23 has gas passages 24 formed in a lattice pattern, and a plurality of gas discharge holes 25 formed respectively in the gas passages 24. Spaces 26 are defined between the gas passages 24. A gas supply pipe 27 extending outward from the chamber 1 is connected to the gas passages 24 of the second gas introduction part 23. The gas supply pipe 27 is connected to a second gas supply source 28. A second processing gas (e.g., $SiH_4$, $C_5F_8$, etc.) such as a processing gas to be supplied without being decomposed as much as possible in the plasma process such as the film forming process and the etching process is supplied from the second gas supply pipe 27.

Different types of gases adapted for the plasma process may be used as the gases supplied from the first gas supply source 22 and the second gas supply source 28.

(Microwave Plasma Source)

As described above, the microwave plasma source 2 includes the microwave output part 30, the microwave transmission part 40 and the microwave radiation member 50.

As shown in FIG. 3, the microwave output part 30 includes a microwave power supply 31, a microwave oscillator 32, an amplifier 33 for amplifying an oscillated microwave, and a distributor 34 for distributing the amplified microwave into a plurality of microwaves.

For example, the microwave oscillator 32 PLL-oscillates a microwave having a predetermined frequency (e.g., 860 MHz). The distributor 34 distributes the microwave amplified in the amplifier 33 while taking an impedance matching between an input side and an output side such that the loss of the microwave occurs as little as possible. Instead of 860 MHz, the microwave may have one selected from a wide frequency ranging from 700 MHz to 3 GHz, for example, 915 MHz.

The microwave transmission part 40 includes a plurality of amplifying parts 42, and peripheral microwave introduction mechanisms 43a and a central microwave introduction mechanism 43b which are provided corresponding to the amplifying parts 42. As shown in FIG. 2, three peripheral microwave introduction mechanisms 43a are disposed at equal intervals on the peripheral portion of the microwave radiation member 50 along a circumferential direction, and the central microwave introduction mechanism 43b is disposed on the central portion of the microwave radiation member 50.

As shown in FIG. 3, the amplifying parts 42 of the microwave transmission part 40 guide the microwaves distributed in the distributor 34 to the peripheral microwave introduction mechanisms 43a and the central microwave introduction mechanism 43b, respectively. Each of the amplifying parts 42 includes a phase shifter 46, a variable gain amplifier 47, a main amplifier 48 constituting a solid state amplifier, and an isolator 49.

The phase shifter 46 is configured to change a phase of a microwave and can adjust the phase to modulate a radiation characteristic. For example, the phase shifter 46 can change the phase of a respective microwave corresponding to each of the microwave introduction mechanisms to control directionality, thus changing a plasma distribution. In addition, the phase shifter 46 can shift the phase by 90 degrees between adjacent microwave introduction mechanisms to obtain a circularly-polarized wave. Further, the phase shifter 46 can adjust a delay characteristic between components in an amplifier such that the phase shifter 46 is used for the purpose of spatial synthesis. However, the phase shifter 46 may be omitted if such modulation of the radiation characteristic and the adjustment of the delay characteristic between components in the amplifier are not required.

The variable gain amplifier 47 is to adjust a power level of microwave to be inputted to the main amplifier 48, thus adjusting a plasma intensity. By changing the variable gain amplifier 47 for each antenna module, it is possible to allow a distribution to be produced in generated plasma.

The main amplifier 48 constituting a solid state amplifier may be configured to include, for example, an input matching circuit, a semiconductor amplifying element, an output matching element and a high Q resonance circuit.

The isolator 49 is used to isolate a reflected microwave which is reflected at a slot antenna (which will be described later) and orients to the main amplifier 48, and includes a circulator and a dummy load (coaxial terminator). The circulator guides the reflected microwave to the dummy load. The dummy load converts the reflected microwave guided by the circulator into heat.

Each of the peripheral microwave introduction mechanisms 43a and the central microwave introduction mechanism 43b has the function of introducing the microwave outputted from the respective amplifying part 42 into the microwave radiation member 50 and an impedance matching function, as will be described later.

(Microwave Radiation Member)

Figure 4:
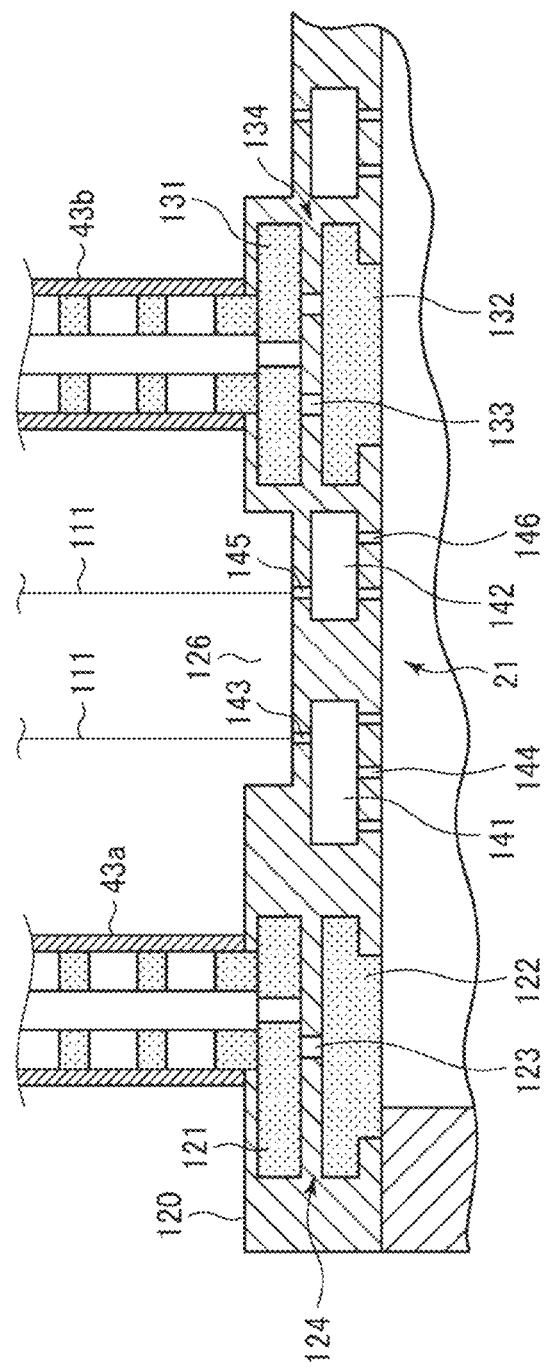
FIG. 4 is a sectional view illustrating a microwave radiation member in the microwave plasma source used for the plasma processing apparatus of FIG. 1.
Figure 5:
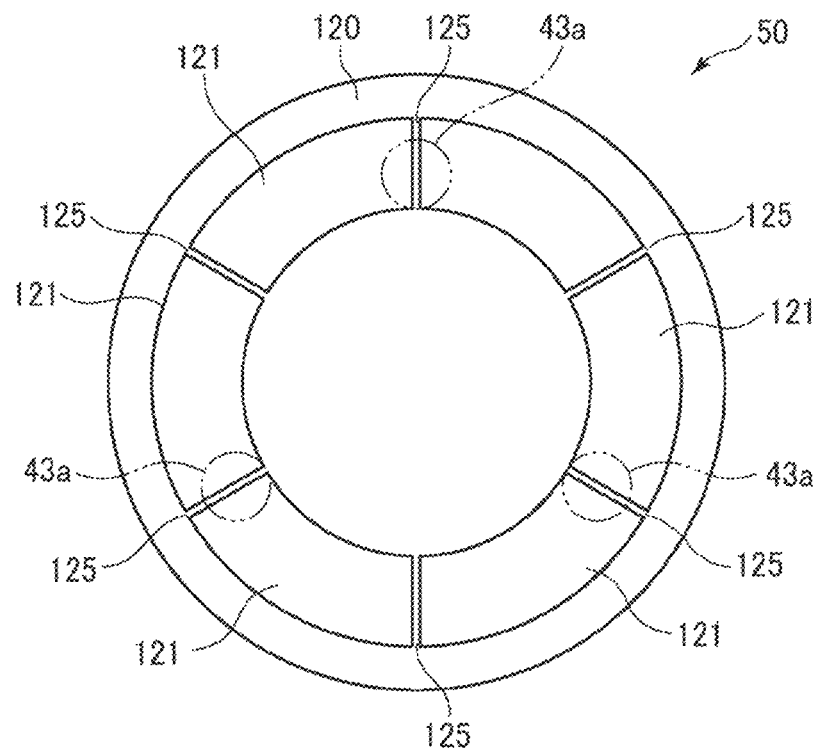
FIG. 5 is a plan view illustrating an arrangement of a slow-wave member disposed in a peripheral portion of the microwave radiation member.
Figure 6:
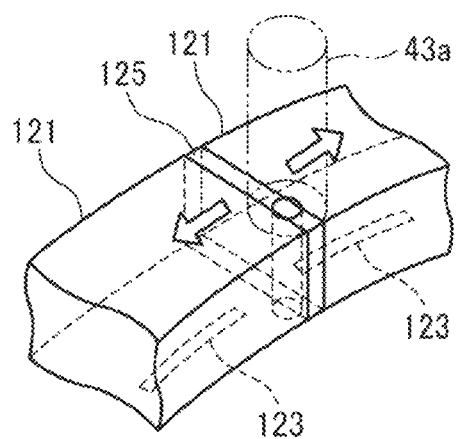
FIG. 6 is a schematic view illustrating a distribution of microwave power by the slow-wave member disposed in the peripheral portion of the microwave radiation member.

Next, the microwave radiation member 50 of the microwave plasma source 2 will be described in more detail. FIG. 4 is a sectional view illustrating main parts of the microwave radiation member 50. FIG. 5 is a view illustrating an arrangement of slow-wave members on a surface of the peripheral portion of the microwave radiation member 50. FIG. 6 is a view illustrating an arrangement of slots in a planar slot antenna in the peripheral portion of the microwave radiation member 50.

The microwave radiation member 50 includes a metal main body 120, the peripheral portion in which the peripheral microwave introduction mechanisms 43a are disposed, and the central portion in which the central microwave introduction mechanism 43b is disposed. The peripheral portion corresponds to a peripheral region of the wafer W and the central portion corresponds to a central region of the wafer.

A plurality of slow-wave members 121 is fitted into an upper portion of an peripheral portion of the main body 120 in an annular peripheral microwave introduction mechanism arrangement region including a sector where the peripheral microwave introduction mechanism 43a are disposed. An annular microwave transmission member 122 made of dielectric is fitted into an lower portion of the peripheral portion of the main body 120 in the annular peripheral microwave introduction mechanism arrangement region. A slot antenna part 124 is formed between the plurality of slow-wave members 121 and the microwave transmission member 122.

As shown in FIG. 5, the slow-wave members 121 of an arc shape are installed at six positions which are twice as many as the peripheral microwave introduction mechanisms 43a, so that they are arranged in an overall annular shape. These six slow-wave members 121 are disposed at equal intervals. Two adjacent slow-wave members 121 are separated from each other by a metal member 125 constituting a portion of the main body 120.

As shown in FIG. 6, each of the peripheral microwave introduction mechanisms 43a is disposed to span between two slow-wave members 121. That is to say, the six slow-wave members 121 are arranged to extend to both sides from a position where each of the peripheral microwave introduction mechanisms 43a is disposed. In this way, since the metal member 125 is disposed immediately below each of the peripheral microwave introduction mechanisms 43a, a microwave power transmitted through the respective peripheral microwave introduction mechanism 43a is separated by the metal member 125 and is equally distributed to the slow-wave members 121 at both sides thereof.

Each of the slow-wave members 121 has a dielectric constant greater than that in a vacuum and is made of, for example, quartz, ceramics, a fluorine-based resin such as polytetrafluoroethylene, or a polyimide-based resin. In addition, since the wavelength of a microwave is lengthened in vacuum, the slow-wave member 121 has the function of reducing an antenna by shortening the microwave wavelength.

The microwave transmission member 122 is made of a dielectric material permitting a microwave to pass therethrough and has the function of forming a surface wave plasma uniform in the circumferential direction. Like the slow-wave member 121, the microwave transmission member 122 may be made of, for example, quartz, ceramics, a fluorine-based resin such as polytetrafluoroethylene, or a polyimide-based resin. In some embodiments, the microwave transmission member 122 may be divided into several pieces in the circumferential direction.

The slot antenna part 124 constitutes a portion of the main body 120 and has a flat plate shape. The slot antenna part 124 converts the microwave, which is transmitted as a mode of TEM wave from the peripheral microwave introduction mechanisms 43a, into a mode of TE wave, and radiates the same into the chamber 1 via the microwave transmission member 122.

Figure 7:
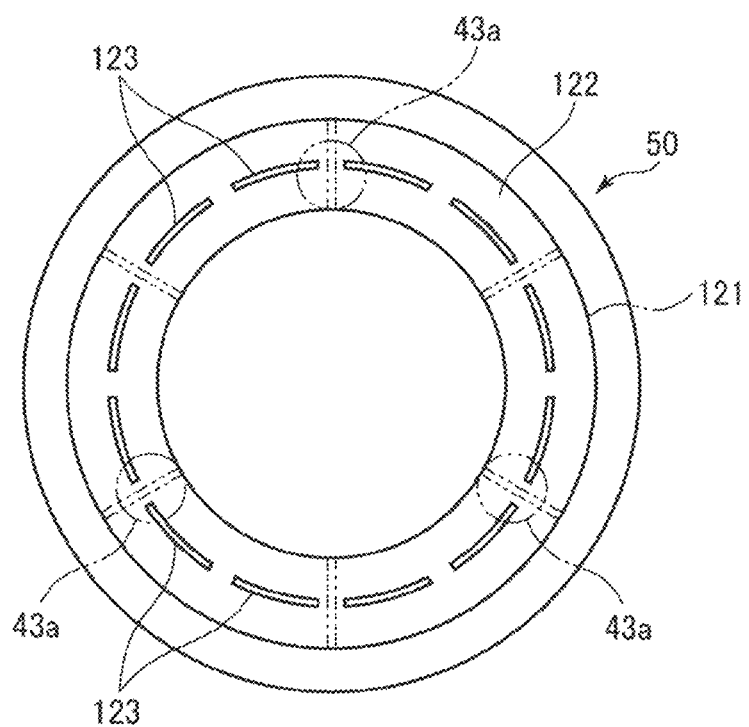
FIG. 7 is a schematic view illustrating a shape and arrangement of a slot in the peripheral portion of the microwave radiation member.

As shown in FIG. 4, slots 123 are respectively formed to penetrate from an upper position in contact with the slow-wave member 121 of the main body 120 to a lower position in contact with the microwave transmission member 122. The slots 123 determine the radiation characteristic of the microwave transmitted from each of the peripheral microwave introduction mechanisms 43a. Peripheral portions of the slots 123 between the main body 120 and the microwave transmission member 122 are sealed by a seal ring (not shown) and act as a vacuum seal as the microwave transmission member 122 covers and closely seals the slot 123. Antenna directionality is determined by such shape and arrangement of the slots 123. The slots 123 have an arc shape individually and are formed to have a circumferential shape in its entirety in the circumferential direction of the annular peripheral microwave introduction mechanism arrangement region such that an electric field is uniformly distributed. As shown in FIG. 7, in this embodiment, 12 arc-like slots 123 are arranged in a line along the peripheral microwave introduction mechanism arrangement region.

The slots 123 are formed at the center in a width direction (radial direction) of the slow-wave member 121 and the microwave transmission member 122, whereas the peripheral microwave introduction mechanisms 43a are disposed inward from the center in the width direction. This is to evenly distribute the electric field between the inside and the outside in consideration of a difference in length between an inner periphery and an outer peripheral portion of the slow-wave member 121.

A pair of the slots 123 is formed in each of the slow-wave members 121. In some embodiments, a length of the slot 123 may be $\lambda g/2$ in the circumferential direction. Where, $\lambda g$ is an effective wavelength of a microwave and may be expressed as $\lambda/\varepsilon_s^{1/2}$. Where, $\varepsilon_s$ is a dielectric constant of a dielectric filled in a slot, and $\lambda$ is a wavelength of a microwave in a vacuum.

The slots 123 are designed to allow a strong electric field to be uniformly radiated. However, when there is an annular microwave transmission member 122 as shown in this embodiment, there is a possibility that a plurality of surface wave modes appears. Further, there is a possibility of microwave interference where a microwave intrudes from one peripheral microwave introduction mechanism 43a into another peripheral microwave introduction mechanism 43a. On this account, the shape and arrangement of the slots 123 are optimized depending on conditions such as a material of the slow-wave member 121, a frequency of a microwave and so on in consideration of intensity and uniformity of an electric field, the number of surface wave modes, and minimized microwave interference between the peripheral microwave introduction mechanisms 43a.

The slots 123 may be filled with a dielectric, although they may be vacuous. When the slots 123 are filled with the dielectric, a microwave effective wavelength can be shortened and the slots can be formed to be thinner. An example of the dielectric with which the slots 123 are filled may include quartz, ceramics, a fluorine-based resin such as polytetrafluoroethylene, or a polyimide-based resin.

The shape and arrangement of the slots 123 in this embodiment are suitably employed to realize an apparatus adapted for a wafer having a diameter of 300 mm by using alumina having a dielectric constant of about 10 as dielectrics in the slow-wave member 121, the microwave transmission member 122 and the slots 123, with a microwave frequency of 860 MH, and allow the number of surface wave modes to be smaller. The number, shape and arrangement of the slots 123 are appropriately adjusted depending on conditions such as a material of the slow-wave member 121, a microwave frequency and so on.

On the other hand, in an upper portion of the central portion of the main body 120, a disc-like slow-wave member 131 is fitted in a central microwave introduction mechanism arrangement region corresponding to the central microwave introduction mechanism 43b. A disc-like microwave transmission member 132 is installed to face the slow-wave member 131 in a lower portion of the central portion of the main body 120. In addition, a slot antenna part 134 is formed between the slow-wave member 131 and the microwave transmission member 132.

Figure 8:
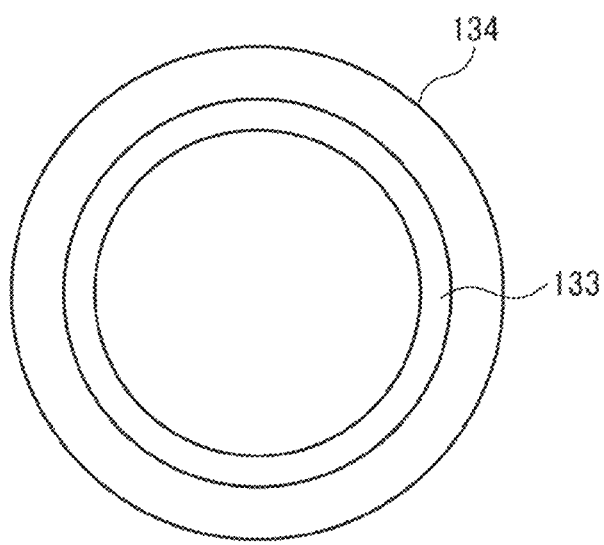
FIG. 8 is a schematic view illustrating an example of the shape of slots corresponding to a central microwave introduction mechanism.

A slot 133 is formed in the slot antenna part 134. A shape and size of the slot 133 are appropriately adjusted to obtain a uniform electric field intensity without generating mode jumping. For example, the slot 133 is formed in a ring shape, as shown in FIG. 8. Thus, since there is no seam in the slot 133, a uniform electric field can be produced and mode jumping is unlikely to occur.

Like the slots 123, the slot 133 may be filled with a dielectric. The dielectric with which the slot 133 is filled may be the same as that used for the slots 123. In addition, a dielectric of which the slow-wave member 131 and the microwave transmission member 132 are made may be the same as that used from the above-described slow-wave member 121 and microwave transmission member 122.

An annular groove 126 is formed in an upper surface of the main body 120 between the peripheral microwave introduction mechanism arrangement region and the central microwave introduction mechanism arrangement region. This configuration suppresses the microwave interference and the mode jumping between the peripheral microwave introduction mechanisms 43a and the central microwave introduction mechanism 43b.

In addition, the above-described first gas introduction part 21 is installed in the main body 120. The first gas introduction part 21 has an annular outer gas diffusion space 141 and an annular inner gas diffusion space 142 which are concentrically formed between a peripheral sector having the peripheral microwave introduction mechanism arrangement region and a central sector having the central microwave introduction mechanism arrangement region. A gas introduction hole 143 extending downward from the upper surface of the main body 120 is formed in an upper surface of the outer gas diffusion space 141. A plurality of gas discharge holes 144 extending to the lower surface of the main body 120 is formed in a lower surface of the outer gas diffusion space 141. On the other hand, a gas introduction hole 145 extending downward from the upper surface of the main body 120 is formed on an upper surface of the inner gas diffusion space 142. A plurality of gas discharge holes 146 extending to the lower surface of the main body 120 is formed in a lower surface of the inner gas diffusion space 142. Each of the gas introduction holes 143 and 145 is connected to a gas supply pipe 111 through which the first gas is supplied from the first gas supply source 22.

The main body 120 may be made of a metal having a high thermal conductivity such as aluminum or copper.

(Microwave Introduction Mechanism)

Next, a microwave introduction mechanism will be described in detail.

Figure 9:
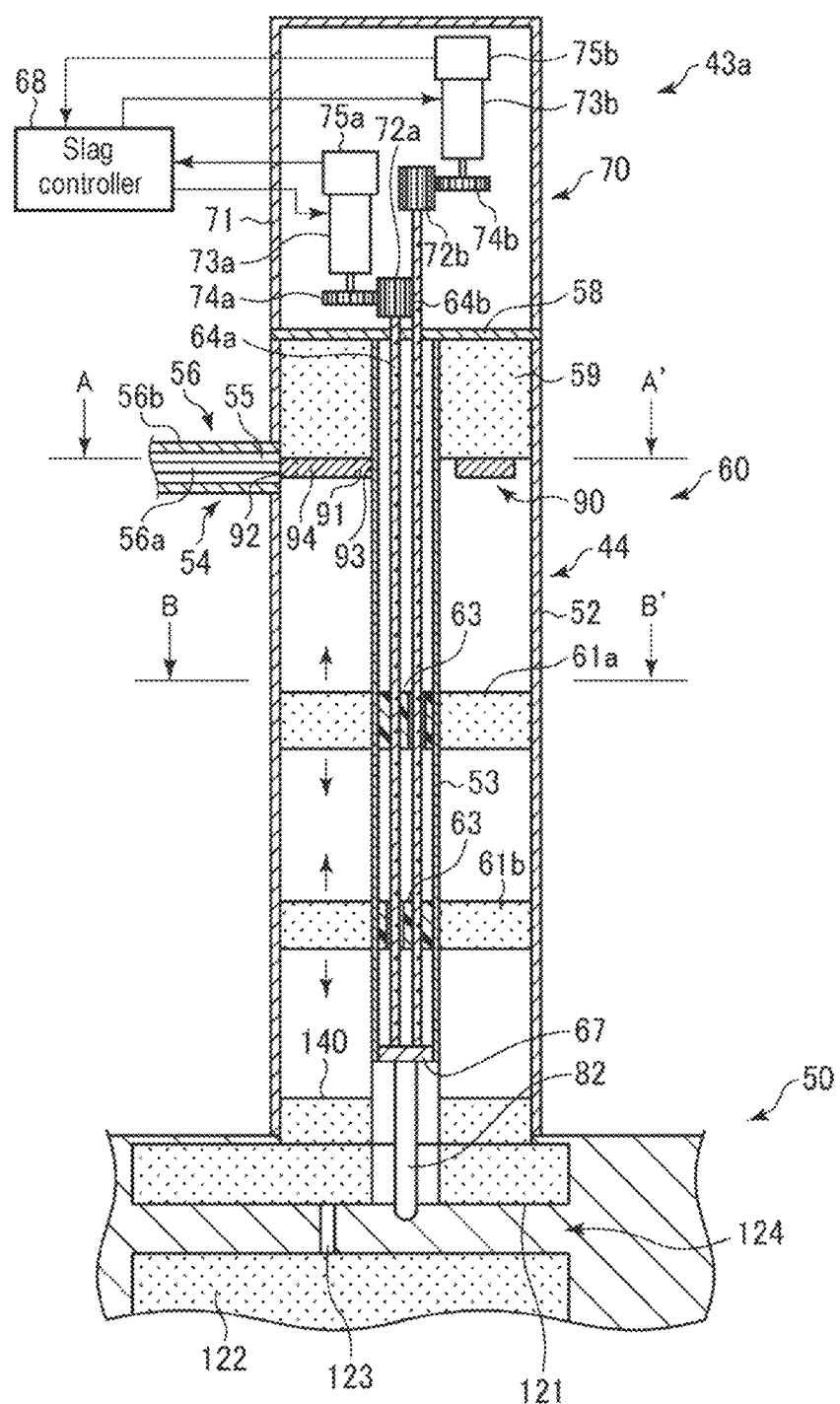
FIG. 9 is a sectional view illustrating peripheral microwave introduction mechanisms.
Figure 10:
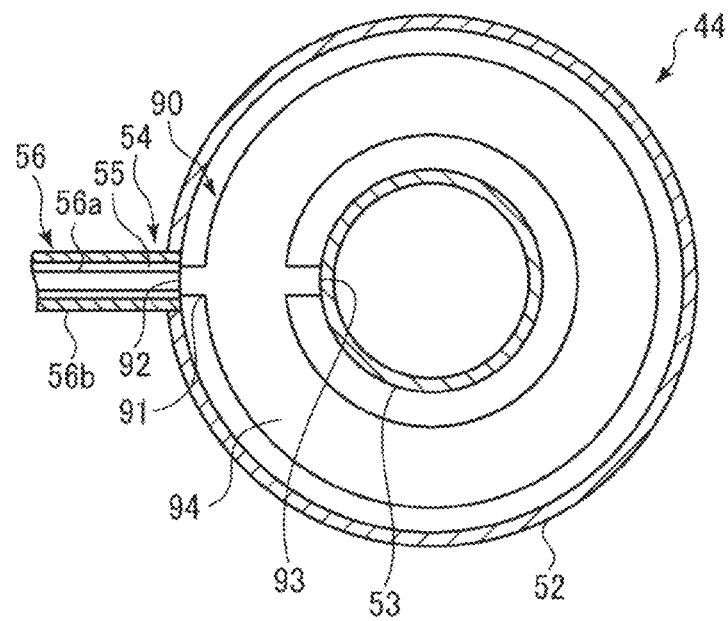
FIG. 10 is a cross-sectional view taken along a line A-A' in FIG. 9, illustrating a power feeding mechanism of the peripheral microwave introduction mechanisms.
Figure 11:
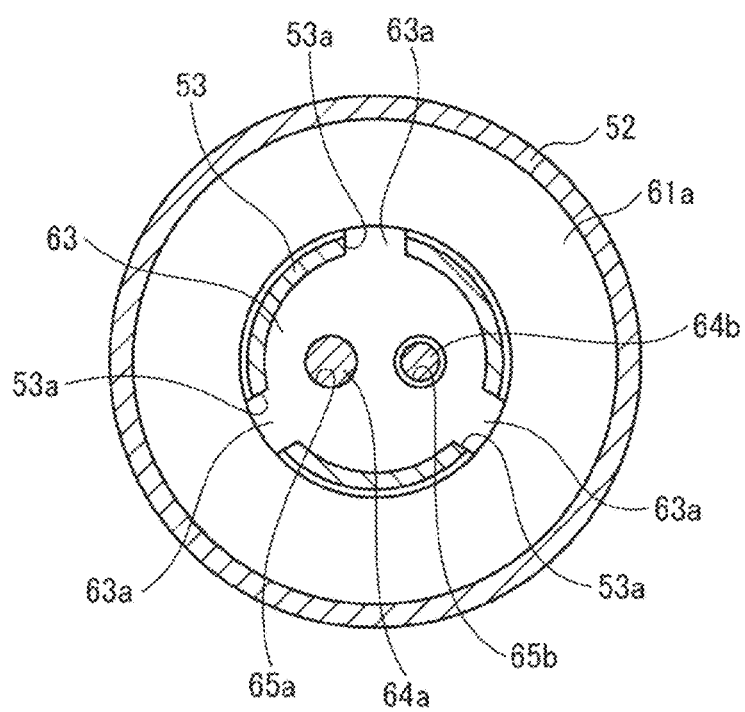
FIG. 11 is a cross-sectional view taken along a line B-B' in FIG. 9, illustrating a slag and a slip member in the peripheral microwave introduction mechanisms.

The peripheral microwave introduction mechanism 43a will be described below. FIG. 9 is a sectional view illustrating the peripheral microwave introduction mechanism 43a. FIG. 10 is a cross-sectional view taken along a line A-A' in FIG. 9, illustrating a power feeding mechanism of the peripheral microwave introduction mechanism 43a. FIG. 11 is a cross-sectional view taken along a line B-B' in FIG. 9, illustrating a slag and a slip member in the peripheral microwave introduction mechanism 43a.

As shown in FIG. 9, the peripheral microwave introduction mechanism 43a includes an introduction mechanism body 60 configured as a slag tuner, and a slag driver 70 for driving a slag. A microwave is radiated from the introduction mechanism body 60 into the chamber 1 via the slow-wave members 121, the slots 123 and the microwave transmission member 122 of the microwave radiation member 50 so that the surface wave plasma is formed inside the chamber 1 by the radiated microwave.

The introduction mechanism body 60 includes a microwave transmission channel 44 formed by a cylindrical outer conductor 52 and a rod-like inner conductor 53 disposed in the center of the outer conductor 52, which are coaxially arranged, and first and second slags 61a and 61b which are configured to vertically move between the outer conductor 52 and the inner conductor 53. The first slag 61a is disposed in the upper side and the second slag 61b is disposed in the lower side. The inner conductor 53 corresponds to a power feeding side and the outer conductor 52 corresponds to a ground side. Upper ends of the outer conductor 52 and the inner conductor 53 are connected to a reflective plate 58, and lower ends thereof are connected to the slot antenna part 124. The first and second slags 61a and 61b have the function of matching the impedance of a load (plasma) in the chamber 1 to the characteristic impedance of the microwave power supply 31 in the microwave output part 30 as these slags are moved.

A power feeding mechanism 54 for feeding a microwave (electromagnetic wave) is installed at a proximal end side of the microwave transmission channel 44. The power feeding mechanism 54 includes a microwave power introduction port 55 which is formed in a lateral side of the microwave transmission channel 44 (the outer conductor 52) to introduce a microwave power therethrough. The microwave power introduction port 55 is connected to a coaxial line 56 used as a power feeding line through which the microwave amplified at the amplifying part 42 is supplied. The coaxial line 56 is composed of an inner conductor 56a and an outer conductor 56b. A leading end of the inner conductor 56a of the coaxial line 56 is connected to a feed antenna 90 which horizontally expands toward the interior of the outer conductor 52.

The feed antenna 90 is formed, for example by cutting a metal plate such as aluminum and then putting the cut metal plate into a mold of a dielectric member such as Teflon®. A slow-wave member 59 made of a dielectric such as Teflon® and configured to shorten an effective wavelength of a reflected wave is interposed between the reflective plate 58 and the feed antenna 90. If a microwave having a high frequency of, e.g., 2.45 GHz is used, the slow-wave member 59 may be omitted. In this case, by optimizing a distance from the feed antenna 90 to the reflective plate 58 and reflecting an electromagnetic wave, which is radiated from the feed antenna 90, at the reflective plate 58, a maximum of electromagnetic wave is transmitted into the microwave transmission channel 44 of the coaxial structure.

As shown in FIG. 10, the feed antenna 90 includes an antenna body 91 and a ring-shaped reflective part 94. The antenna body 91 includes a first pole 92 which is connected to the inner conductor 56a of the coaxial line 56 in the microwave power introduction port 55 and is supplied thereto with the electromagnetic wave, and a second pole 93 for radiating the supplied electromagnetic wave. The ring-shaped reflective part 94 is formed to extend along an outer side of the inner conductor 53 from both sides of the antenna body 91. The feed antenna 90 is configured to form a standing wave with the electromagnetic wave incident into the antenna body 91 and an electromagnetic wave reflected at the reflective part 94. The second pole 93 of the antenna body 91 is in contact with the inner conductor 53.

When the feed antenna 90 radiates the microwave (electromagnetic wave) so that the microwave power is fed into a space between the outer conductor 52 and the inner conductor 53. Then, the microwave power supplied into the power feeding mechanism 54 propagates toward the microwave radiation member 50.

In an internal space of the inner conductor 53 are placed two slag moving shafts 64a and 64b for slag movement, each being composed of a trapezoidal threaded rod extending in a longitudinal direction of the inner conductor 53.

As shown in FIG. 11, the first slag 61a made of dielectric has an annular shape, and a slip member 63 made of a slippery resin is fitted into the first slag 61a. The slip member 63 is formed with a screw hole 65a with which the slag moving shaft 64a is screwed, and a through hole 65b into which the slag moving shaft 64b is inserted. Likely, the slag 61b has also a screw hole 65a and a through hole 65b. However, contrary to the slag 61a, the screw hole 65a is screwed with the slag moving shaft 64b and the slag moving shaft 64a is inserted into the through hole 65b. With this configuration, the first slag 61a is moved up and down as the slag moving shaft 64a is rotated, while the second slag 61b is moved up and down as the slag moving shaft 64b is rotated. That is to say, the first slag 61a and the second slag 61b are moved up and down by means of a screw mechanism composed of the slag moving shafts 64a and 64b and the slip member 63.

Three slits 53a are formed at equal intervals in the inner conductor 53 in the longitudinal direction. The slip member 63 has three projections 63a formed at equal intervals to correspond to these slits 53a. The slip member 63 is fitted into the first slag 61a and the second slag 61b while the projections 63a are brought into contact with inner peripheries of the first and second slags 61a and 61b. An outer peripheral surface of the slip member 63 is in contact with an inner peripheral surface of the inner conductor 53 with no margin. Therefore, when the slag moving shafts 64a and 64b are rotated, the slip member 63 is moved up and down while sliding along the inner conductor 53. That is to say, the inner peripheral surface of the inner conductor 53 acts as a sliding guide for guiding the first and second slags 61a and 61b.

The slag moving shafts 64a and 64b extend up to the slag driver 70 through the reflective plate 58. A bearing (not shown) is interposed between the slag moving shafts 64a and 64b and the reflective plate 58.

The slag driver 70 includes a housing 71 into which the slag moving shafts 64a and 64b extend. Gears 72a and 72b are respectively installed on upper ends of the slag moving shafts 64a and 64b. In addition, the slag driver 70 includes a motor 73a for rotating the slag moving shaft 64a and a motor 73b for rotating the slag moving shaft 64b. A gear 74a is attached to a shaft of the motor 73a and a gear 74b is attached to a shaft of the motor 73b. Thus, the gear 74a engages with the gear 72a and the gear 74b engages with the gear 72b. Therefore, the slag moving shaft 64a is rotated by the motor 73a through the gears 74a and 72a, and the slag moving shaft 64b is rotated by the motor 73b through the gears 74b and 72b. The motors 73a and 73b are, for example, stepping motors.

The slag moving shaft 64b is longer than the slag moving shaft 64a so that the slag moving shaft 64b is extended to a higher level. Therefore, since vertical positions of the gears 72a and 72b are offset and the motors 73a and 73b are also vertically offset, a space for a power transmission mechanism composed of the motors and gears may be small and the housing 71 may have the same diameter as that of the outer conductor 52.

On the motors 73a and 73b are respectively installed incremental encoders 75a and 75b which are directly connected to output shafts of the respective motors to detect positions of the first and second slags 61a and 61b.

The positions of the first and second slags 61a and 61b are controlled by a slag controller 68. Specifically, based on an input terminal impedance value detected by an impedance detector (not shown) and position information of the first and second slags 61a and 61b detected by the encoders 75a and 75b, the slag controller 68 sends control signals to the motors 73a and 73b to control the positions of the first and second slags 61a and 61b. In this way, an impedance adjustment is performed. The slag controller 68 executes an impedance matching such that a resistance of a terminal becomes, for example, 50Ω. If only one of the two slags 61a and 61b is moved, the impedance draws a trajectory which passes through the origin of the Smith chart. If both of the two slags 61a and 61 b are moved, only a phase is rotated.

An impedance adjusting member 140 is installed at a leading end of the microwave transmission channel 44. The impedance adjusting member 140 may be made of dielectric and is configured to adjust the impedance of the microwave transmission channel 44 based on a dielectric constant of the dielectric. A cylindrical member 82 is disposed on a bottom plate at the leading end of the microwave transmission channel 44. The cylindrical member 82 is connected to the slot antenna part 124. The slow-wave member 121 can adjust the phase of the microwave by its thickness. The thickness of the slow-wave member 121 is adjusted such that the upper surface (microwave radiation surface) of the slot antenna part 124 corresponds to a "belly" of the standing wave. This allows reflection to be at a minimum and microwave radiation energy to be at a maximum.

In this embodiment, the main amplifier 48, the introduction mechanism body 60 constituting the slag tuner, and the slot antenna part 124 of the microwave radiation member 50 are arranged adjacent to each other. A combination of the slag tuner and the slot antenna part 124 constitutes a lumped constant circuit which exists in a ½ wavelength. In addition, a combined resistance of the slot antenna part 124 and slow-wave member 121 is set to 50Ω Thus, the slag tuner can directly tune a plasma load, which makes it possible to transfer energy to the plasma with high efficiency.

The central microwave introduction mechanism 43b has the same configuration and function as those of the peripheral microwave introduction mechanisms 43a except that the microwave is transmitted to the slot antenna part 134 through the slow-wave member 131.

<Operation of Plasma Processing Apparatus>

Next, an operation of the plasma processing apparatus 100 configured as above will be described.

First, a wafer W is loaded into the chamber 1 and is mounted on the susceptor 11. Then, a plasma generation gas such as an Ar gas, or a first gas to be decomposed with high energy is discharged from the first gas supply source 22 into the chamber 1 via the gas supply pipe 111 and the first gas introduction part 21 of the microwave radiation member 50.

Specifically, the plasma generation gas or the processing gas is supplied from the first gas supply source 22 into the outer gas diffusion space 141 and the inner gas diffusion space 142 of the first gas introduction part 21 via the gas introduction holes 143 and 145 through the gas supply pipe 111, and subsequently, is discharged from the gas discharge holes 144 and 146 into the chamber 1.

On the other hand, microwaves, which are transmitted from the microwave output part 30 of the microwave plasma source 2 to the plurality of amplifying parts 42 and the plurality of microwave introduction mechanisms 43 of the microwave transmission part 40, are radiated into the chamber 1 through the microwave radiation member 50. Then, a surface wave plasma is generated on the surface of the microwave radiation member 50 by plasmarizing the first gas by the high electric field energy.

In addition, a second gas such as a processing gas to be supplied without being decomposed as much as possible is discharged from the second gas supply source 28 into the chamber 1 through the gas supply pipe 27 and the second gas introduction part 23. The second gas discharged from the second gas introduction part 23 is excited by the plasma of the first gas. At this time, since a position from which the second gas is discharged is a low energy position which is spaced apart from the surface of the microwave radiation member 50, the second gas is excited in a state where unnecessary decomposition is suppressed. In this way, the wafer W is subjected to a plasma process such as a film forming process or an etching process by the plasma of the first and second gases.

At this time, the three peripheral microwave introduction mechanisms 43a are fed with a microwave power which is oscillated at the microwave oscillator 32 of the microwave output part 30, amplified at the amplifier 33, distributed by the distributor 34 and passed through the amplifying part 42. The microwave power fed to these peripheral microwave introduction mechanisms 43a is transmitted through the microwave transmission channel 44 and is introduced onto the peripheral portion of the microwave radiation member 50. At that time, the impedance is automatically matched by the first and second slags 61a and 61b of the introduction mechanism body 60, and the microwave is introduced in a state where very little of the power is reflected. The introduced microwave passes through the slow-wave members 121 and is radiated into the chamber 1 through the slots 123 of the slot antenna part 124 and the microwave transmission member 122. Thus, a surface wave is formed in a sector corresponding to the lower surfaces of the microwave transmission member 122 and the main body 120. The surface wave thus formed allows a surface wave plasma to be generated in a sector immediately below the microwave radiation member 50 inside the chamber 1.

In this case, the six arc-like slow-wave members 121 are arranged to have an overall annular shape along the peripheral microwave introduction mechanism arrangement region, and to be separated by the metal member 125 constituting a portion of the main body 120. The peripheral microwave introduction mechanisms 43a are respectively arranged to span between two slow-wave members 121. That is to say, the six slow-wave members 121 are respectively arranged to extend from a position where each of the three peripheral microwave introduction mechanisms 43a is disposed to both sides thereof. In this manner, since the metal member 125 is disposed immediately below the peripheral microwave introduction mechanisms 43a, the microwave transmitted through each of the peripheral microwave introduction mechanisms 43a is separated by the respective metal member 125 and is equally distributed to the slow-wave members 121 at both sides thereof without increasing an electric field intensity of a portion which lies immediately below the peripheral microwave introduction mechanisms 43a and typically tends to increase in a microwave electric field. Thus, the electric field intensity in the circumferential direction is made to be uniform. In addition, since the microwave is radiated from the slots 123 formed to have the overall circumferential shape along the peripheral microwave introduction mechanism arrangement region and the annular microwave transmission member 122 is disposed to cover the slots 123, the microwave power evenly distributed in the slow-wave members 121 can be uniformly radiated in the slots 123, thus being further expanded in a circumferential shape in the microwave transmission member 122. Therefore, it is possible to form a uniform microwave electric field immediately below the microwave transmission member 122 along the peripheral microwave introduction mechanism arrangement region, thus forming a uniform surface wave plasma inside the chamber 1 in the circumferential direction. Thus, since the microwave power can be expanded in the circumferential direction, it is possible to decrease the number of the peripheral microwave introduction mechanisms 43a, resulting in a reduction in cost of the apparatus.

In addition, by adjusting the number, shape and arrangement of the circumferentially-arranged slots 123, it is possible to decrease the number of surface wave modes. Further, by optimizing the number, shape and arrangement of the slots 123, it is possible to set the number of the surface wave modes to two or one. By reducing the number of the surface wave modes in this manner, it is possible to perform a stable plasma process with less mode jumping. In addition, by adjusting the number, shape and arrangement of the slots 123 in this manner, it is possible to suppress a microwave interference that a microwave intrudes from one peripheral microwave introduction mechanism 43a into another peripheral microwave introduction mechanism 43a.

In addition, since the annular groove 126 is formed in the upper surface of the main body 120 between the peripheral microwave introduction mechanism arrangement region and the central microwave introduction mechanism arrangement region, it is possible to suppress a microwave interference and a mode jumping between the peripheral microwave introduction mechanisms 43a and the central microwave introduction mechanism 43b.

In addition, a microwave is introduced from the central microwave introduction mechanism 43b into the central portion of the microwave radiation member 50. The microwave introduced from the central microwave introduction mechanism 43b transmits through the slow-wave member 131 and is radiated into the chamber 1 through the slots 133 of the slot antenna part 134 and the microwave transmission member 132, thereby generating a surface wave plasma in the internal central portion of the chamber 1. Therefore, it is possible to form a uniform plasma over the entire wafer arrangement region in the chamber 1.

In addition, since the first gas introduction part 21 is installed in the microwave radiation member 50, and the first gas is supplied from the first gas supply source 22 into a region of the upper surface of the chamber into which the microwave is radiated, it is possible to excite the first gas with high energy and thus form plasma in which the gas is decomposed. In addition, since the second gas introduction part 23 configured to supply the second gas is located to be lower than the ceiling of the chamber 1, it is possible to plasmarize the second gas with lower energy without being decomposed. Thus, it is possible to form a desirable plasma state according to a required plasma process.

<Simulation Results>

Next, simulation results which manifest advantages of the present disclosure will be described.

Figure 12:
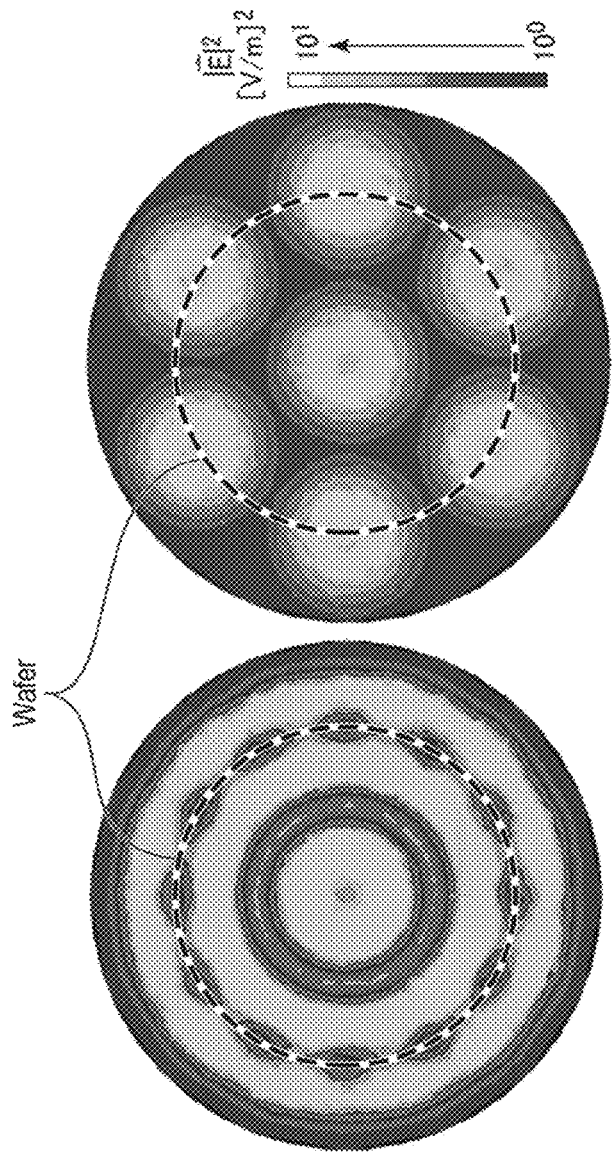
FIGS. 12A and 12B are views illustrating a comparison between an electromagnetic simulation result when a microwave is introduced into a chamber by the microwave plasma source according to an embodiment of the present disclosure and an electromagnetic simulation result of a conventional example in which seven microwave introduction mechanisms are arranged.

FIGS. 12A and 12B show comparisons between an electromagnetic simulation result obtained when a microwave is introduced into the chamber by the microwave plasma source according to the above embodiment and an electromagnetic simulation result of a conventional example in which seven microwave introduction mechanisms having the same structure as that of the central microwave introduction mechanism 43b (including the slow-wave members 131, the slots 133 and the microwave transmission member 132) are evenly arranged to introduce a microwave. For this embodiment shown in FIG. 12A, an electric field intensity is uniform in the circumferential direction of the peripheral microwave introduction mechanism arrangement region in which the peripheral microwave introduction mechanisms 43a are disposed. In contrast, for the conventional example shown in FIG. 12B, the uniformity of electric field intensity in the circumferential direction is insufficient despite the increased number of microwave introduction mechanisms.

Figure 13:
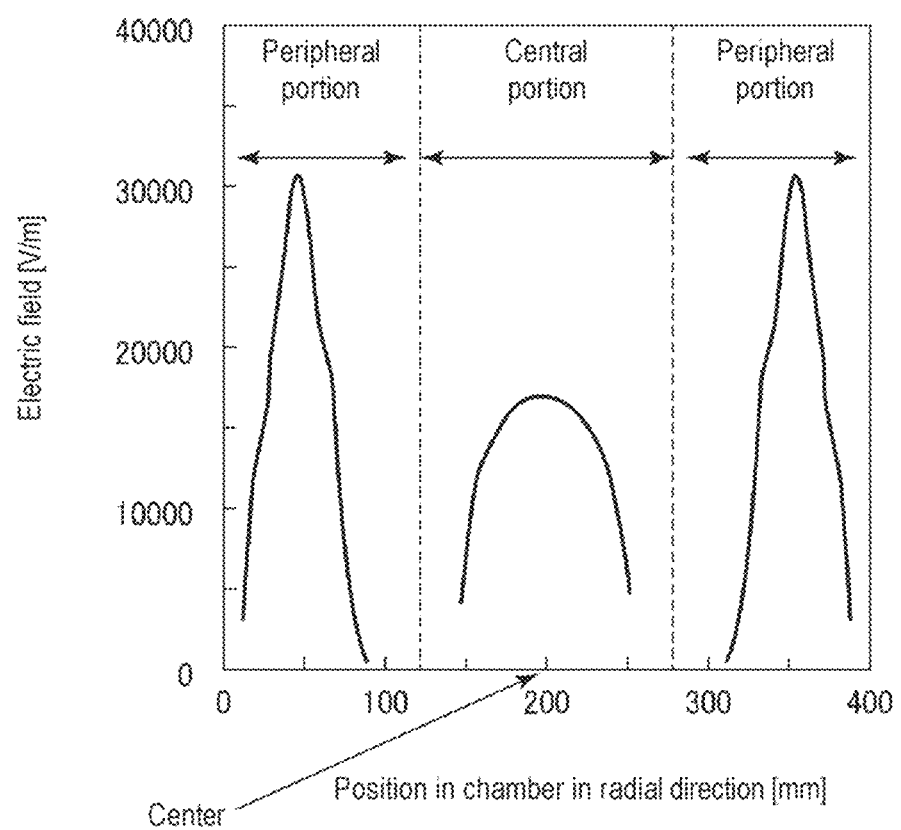
FIG. 13 is a view illustrating an electric field intensity in a radial direction within the chamber by an electromagnetic simulation.

FIG. 13 is a view showing an electric field intensity formed inside a chamber in a radial direction by an electromagnetic simulation. It can be seen from FIG. 13 that, inside the chamber, peripheral portions into which a microwave is introduced from a peripheral microwave introduction mechanisms have higher electric field intensity and ignition performance than a central portion into which a microwave is introduced from a central microwave introduction mechanism.

OTHER EMBODIMENTS

Figure 14:
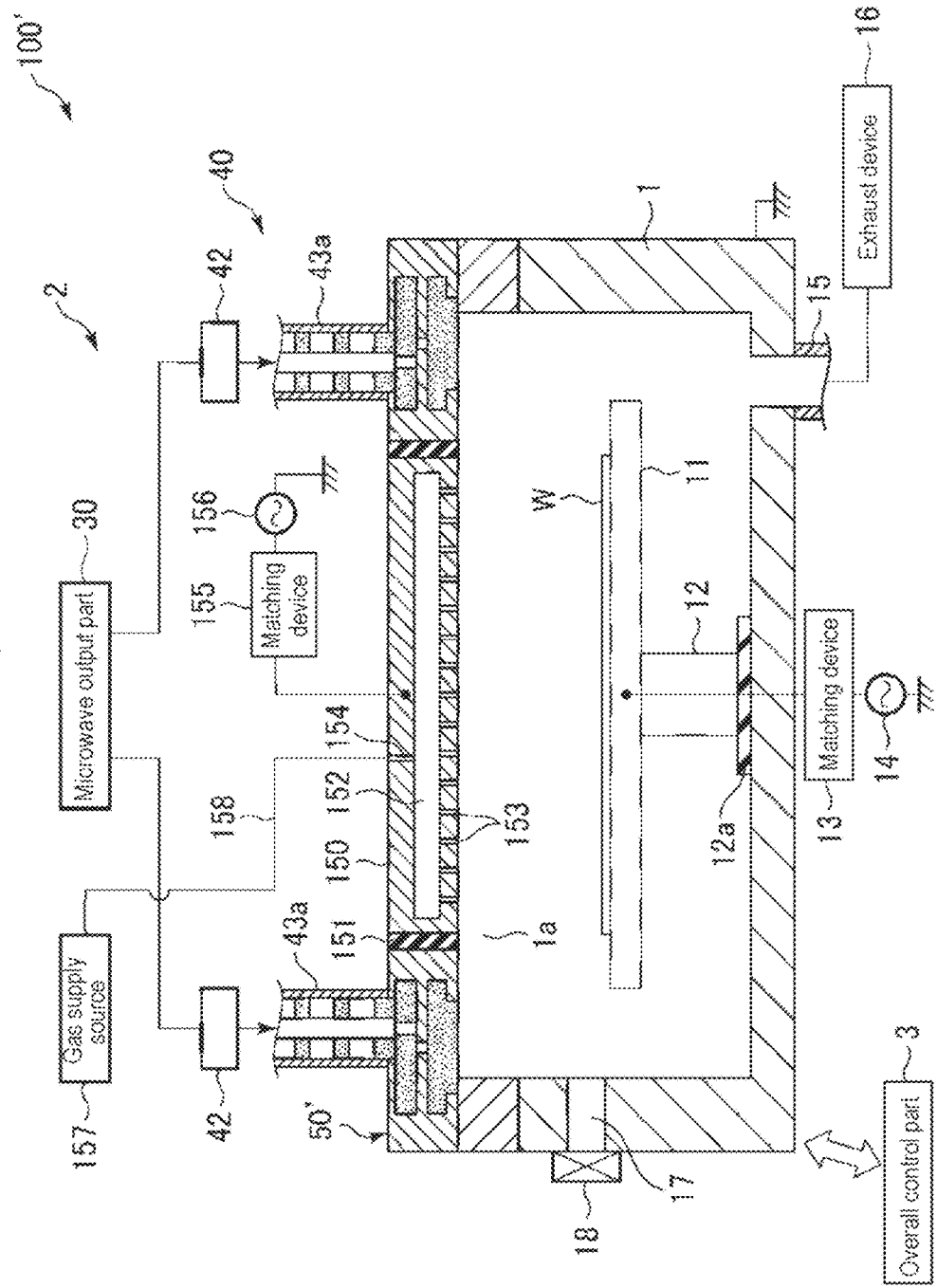
FIG. 14 is a sectional view illustrating a schematic configuration of a plasma processing apparatus according to another embodiment of the present disclosure.

Although it has been illustrated in the above embodiment that the central microwave introduction mechanism 43b is disposed in the central portion of the microwave radiation member 50 such that the surface wave plasma is generated even in a sector corresponding to the central region of the wafer W inside the chamber 1, the focus of the present disclosure is to generate uniform plasma in the circumferential direction and the configuration of the central portion is not limited to the above embodiment. In some embodiments, a capacitively-coupled plasma may be formed in the central portion. FIG. 14 is a sectional view illustrating a schematic configuration of a plasma processing apparatus according to another embodiment of the present disclosure.

As shown in FIG. 14, a plasma processing apparatus 100' according to another embodiment includes a microwave transmission part 40 including three peripheral microwave introduction mechanisms 43a as microwave introduction mechanisms, an annular microwave radiation member 50' having an arrangement region of the peripheral microwave introduction mechanisms 43a instead of the microwave radiation member 50 of FIG. 1, and a conductive shower head 150 which has substantially the same size as that of a wafer W and is disposed in an inner central portion of the microwave radiation member 50' via an insulating member 151. The shower member 150 has a disc-like gas diffusion space 152, a plurality of gas discharge holes 153 formed to face the interior of the chamber 1 from the gas diffusion space 152, and a gas introduction hole 154. A gas supply pipe 158 is connected to the gas introduction hole 154. A gas supply source 157 is connected to the gas supply pipe 158. An RF power supply 156 for plasma generation is electrically connected to the shower head 150 via a matching device 155. A susceptor 11 has a conductive portion and acts as a counter electrode of the shower head 150. Gases required for plasma process are collectively supplied from the gas supply source 157 into the chamber 1 via the gas supply pipe 158 and the shower head 150. When RF power is applied from the RF power supply 156 to the shower head 150, an RF electric field is formed between the shower head 150 and the susceptor 11 and thus the capacitively-coupled plasma is formed in a space immediately above the wafer W. In FIG. 14, the same parts as those of FIG. 1 are denoted by the same reference numerals and explanation of which is not repeated.

The plasma processing apparatus 100' configured as above is similar in configuration to a parallel-plate type plasma etching apparatus which performs a plasma etching on a wafer. Therefore, the plasma processing apparatus 100' can be used as a plasma etching apparatus which adjusts a density of plasma in peripheral portions of a wafer using a microwave-based surface wave plasma.

<Other Applications>

While some embodiments of the present disclosure have been described above with reference to the accompanying drawings, the present disclosure is not limited to the disclosed embodiments but may be modified in different ways within the scope of ideas of the present disclosure. As an example, the focus of the present disclosure is to generate uniform plasma in the peripheral portions, and the configuration of the central portion is not limited to that in the disclosed embodiments but may be modified in various patterns according to a required plasma distribution. In some embodiments, a mechanism for generating plasma in the central portion may be omitted.

In addition, although it has been illustrated in the above embodiments that three peripheral microwave introduction mechanisms 43a are arranged on the peripheral portion of the microwave radiation member 50 in the circumferential direction and six slow-wave members 121 are arranged such that a pair of the slow-wave members 121 extend outward from both sides of a position where each of the peripheral microwave introduction mechanisms 43a is disposed, the number of the peripheral microwave introduction mechanisms 43a is not limited to three but may be two or more, and the slow-wave members 121 may be twice as many as the peripheral microwave introduction mechanisms 43a. These numbers may be appropriately set in order to achieve the advantages of the present disclosure.

In addition, the configurations of the microwave output part 30 and the microwave transmission part 40 are not limited to the above embodiments. As an example, if there is no need to control directionality of a microwave radiated from the slot antenna part or render the microwave into a circularly-polarized wave, no phase shifter is required.

In addition, although it has been illustrated in the above embodiments that the plasma processing apparatus is a film forming apparatus or an etching apparatus, the plasma processing apparatus is not limited thereto but may be used in performing different plasma processes such as an oxynitride film forming process including oxidation and nitridation, an ashing processing, and the like. In addition, a workpiece is not limited to a semiconductor wafer W but may be an FPD (Flat Panel Display) substrate represented by an LCD (Liquid Crystal Display) substrate, a ceramics substrate, or the like.

According to the present disclosure in some embodiments, a plurality of microwave introduction mechanisms is circumferentially arranged in a peripheral portion of a microwave radiation member, a plurality of dielectric slow-wave members is arranged in an overall annular shape in the vicinity of an arrangement surface of a main body of the microwave radiation member on which the microwave introduction mechanisms are arranged, along an annular microwave introduction mechanism arrangement region. The plurality of slow-wave members is arranged with adjacent slow-wave members separated from each other by a metal member, and is twice as many as the microwave introduction mechanisms. Further, the plurality of slow-wave members is arranged such that a pair of the slow-wave members extends to both sides from a position where each of the respective microwave introduction mechanisms is disposed. Therefore, a microwave transmitted through the microwave introduction mechanisms is separated by the metal member and is equally distributed to the slow-wave members at both sides thereof without increasing an electric field intensity of a portion which lies immediately below the peripheral microwave introduction mechanisms and typically tends to increase in a microwave electric field. Thus, the electric field intensity in the circumferential direction is made to be uniform. The microwave is radiated through circumferential slots and is circumferentially expanded in the annular microwave transmission member. Therefore, it is possible to form a uniform microwave electric field along a microwave introduction mechanism arrangement region immediately below the microwave transmission member and it is also possible to form uniform surface wave plasma inside the chamber in the circumferential direction. In addition, in this way, since microwave power can be expanded in the circumferential direction, it is possible to decrease the number of microwave introduction mechanisms, resulting in a reduction in cost of an apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A microwave plasma source for forming a surface wave plasma by radiating a microwave into a chamber of a plasma processing apparatus, comprising:
    a microwave output part configured to generate and output the microwave;
    a microwave transmission part configured to transmit the microwave outputted from the microwave output part; and
    a microwave radiation member constituting a ceiling wall of the chamber and configured to radiate the microwave, which is supplied from the microwave transmission part, into the chamber,
    wherein the microwave transmission part includes a plurality of microwave introduction mechanisms which is circumferentially arranged in a peripheral portion of the microwave radiation member corresponding to an internal peripheral portion of the chamber and is configured to introduce the microwave into the microwave radiation member,
    wherein the microwave radiation member includes:
    a metal main body;
    a plurality of dielectric slow-wave members which is arranged in an overall annular shape in the vicinity of an arrangement surface of the main body on which the microwave introduction mechanisms are arranged, along an annular microwave introduction mechanism arrangement region including a portion where the plurality of microwave introduction mechanisms is arranged;
    an annular dielectric microwave transmission member which is arranged in a microwave radiation surface of the main body along the microwave introduction mechanism arrangement region; and
    a slot antenna part installed between the slow-wave members and the microwave transmission member and has a plurality of microwave radiation slots formed in an overall circumferential shape along the microwave introduction mechanism arrangement region,
    wherein the plurality of slow-wave members is arranged such that adjacent slow-wave members are separated from each other by metal members, the plurality of slow-wave members being twice as many as the microwave introduction mechanisms and being arranged to extend to both sides of a position where each of the microwave introduction mechanisms is disposed, and
    wherein each of the metal members is disposed immediately below each of the plurality of microwave introduction mechanisms.

2. The microwave plasma source of claim 1, wherein the slots, each of which having an arc shape, are arranged in a line along the microwave introduction mechanism arrangement region.

3. The microwave plasma source of claim 1, wherein the microwave radiation member further includes a gas introduction part configured to introduce a gas to be used for a plasma process into the chamber.

4. The microwave plasma source of claim 1, wherein the microwave radiation member has a disc shape and further includes another microwave introduction mechanism arranged in a central portion of the microwave radiation member, which corresponds to a central portion of the chamber, and is configured such that the surface wave plasma is generated in the central portion of the chamber through the central portion of the microwave radiation member.

5. The microwave plasma source of claim 4, wherein an annular groove is formed between the microwave introduction mechanism arrangement region and a region where the another microwave introduction mechanism is arranged, in an upper surface of the microwave radiation member.

6. A plasma processing apparatus comprising a chamber configured to accommodate a target substrate, a gas supply mechanism configured to supply a gas into the chamber, and a microwave plasma source configured to form a surface wave plasma by radiating a microwave into the chamber, the apparatus configured to perform a plasma process on the target substrate using the surface wave plasma, wherein the microwave plasma source includes:
a microwave output part configured to generate and output a microwave;
a microwave transmission part configured to transmit the microwave outputted from the microwave output part; and
a microwave radiation member constituting a ceiling wall of the chamber and configured to radiate the microwave, which is supplied from the microwave transmission part, into the chamber,
wherein the microwave transmission part includes a plurality of microwave introduction mechanisms which is circumferentially arranged in a peripheral portion of the microwave radiation member, which corresponds to an internal peripheral portion of the chamber, and is configured to introduce the microwave into the microwave radiation member,
wherein the microwave radiation member includes:
a metal main body;
a plurality of dielectric slow-wave members which is arranged in an overall annular shape in the vicinity of an arrangement surface of the main body on which the microwave introduction mechanisms are arranged, along an annular microwave introduction mechanism arrangement region including a portion where the plurality of microwave introduction mechanisms is arranged;
an annular dielectric microwave transmission member which is arranged in a microwave radiation surface of the main body along the microwave introduction mechanism arrangement region; and
a slot antenna part which is interposed between the slow-wave members and the microwave transmission member and has a plurality of microwave radiation slots formed in an overall circumferential shape along the microwave introduction mechanism arrangement region,
wherein the plurality of slow-wave members is arranged such that adjacent slow-wave members are separated from each other by metal members, the plurality of slow-wave members being twice as many as the microwave introduction mechanisms and being arranged to extend to both sides of a position where each of the microwave introduction mechanisms is disposed, and
wherein each of the metal members is disposed immediately below each of the plurality of microwave introduction mechanisms.

7. The plasma processing apparatus of claim 6, wherein the slots, each of which having an arc shape, are arranged in a line along the microwave introduction mechanism arrangement region.

8. The plasma processing apparatus of claim 6, wherein the gas supply mechanism includes a first gas introduction part disposed in the microwave radiation member and configured to introduce a first gas therethrough.

9. The plasma processing apparatus of claim 8, wherein a mounting table on which the target substrate is mounted is placed inside the chamber, and
wherein the gas supply mechanism includes a second gas introduction part installed between the microwave radiation member and the mounting table and configured to introduce a second gas to be used for a plasma process therethrough.

10. The plasma processing apparatus of claim 6, wherein the microwave radiation member has a disc shape and further includes another microwave introduction mechanism arranged in a central portion of the microwave radiation member, which corresponds to a central portion of the chamber, and is configured such that the surface wave plasma is generated in the central portion of the chamber through the central portion of the microwave radiation member.

11. The plasma processing apparatus of claim 10, wherein an annular groove is formed between the microwave introduction mechanism arrangement region and a region where the another microwave introduction mechanism is arranged, in an upper surface of the microwave radiation member.

12. The plasma processing apparatus of claim 6, wherein the microwave radiation member has an annular shape which corresponds to the internal peripheral portion of the chamber,
wherein the plasma processing apparatus further comprises:
a mounting table on which the target substrate is mounted;
a shower head disposed in an inner portion of the microwave radiation member and configured to introduce a gas to be used for the plasma process into the chamber in a shower pattern; and
an RF (Radio Frequency) electric field forming mechanism configured to form an RF electric field between the shower head and the mounting table, and
wherein a capacitively-coupled plasma is formed in the chamber by the RF electric field forming mechanism.

* * * * *